United States Patent [19]

Mason et al.

[11] 3,934,239

[45] Jan. 20, 1976

[54] ADJUSTABLE ELECTRONIC LOAD-ALARM RELAY

[75] Inventors: Charles H. Mason, Paducah; Roy S. Sitton, Kevil, both of Ky.

[73] Assignee: The United States of America as represented by the United States Energy Research and Development Administration, Washington, D.C.

[22] Filed: Sept. 27, 1974

[21] Appl. No.: 509,996

[52] U.S. Cl. .......................... 340/248 A; 307/235 R
[51] Int. Cl.² ....................................... G08B 21/00
[58] Field of Search ............ 340/248, 253; 328/146, 328/148, 135; 307/235 R

[56] References Cited
UNITED STATES PATENTS

| | | | |
|---|---|---|---|
| 3,761,827 | 9/1973 | Tchang | 307/235 R X |
| 3,813,665 | 5/1974 | Parfomak et al. | 340/248 A |

*Primary Examiner*—John W. Caldwell
*Assistant Examiner*—Daniel Myer
*Attorney, Agent, or Firm*—Dean E. Carlson; David S. Zachry; Fred O. Lewis

[57] ABSTRACT

This invention is an improved electronic alarm relay for monitoring the current drawn by an AC motor or other electrical load. The circuit is designed to measure the load with high accuracy and to have excellent alarm repeatability. Chattering and arcing of the relay contacts are minimal. The operator can adjust the set point easily and can re-set both the high and the low alarm points by means of one simple adjustment. The relay includes means for generating a signal voltage proportional to the motor current. In a preferred form of the invention a first operational amplifier is provided to generate a first constant reference voltage which is higher than a preselected value of the signal voltage. A second operational amplifier is provided to generate a second constant reference voltage which is lower than the aforementioned preselected value of the signal voltage. A circuit comprising a first resistor serially connected to a second resistor is connected across the outputs of the first and second amplifiers, and the junction of the two resistors is connected to the inverting terminal of the second amplifier. Means are provided to compare the aforementioned signal voltage with both the first and second reference voltages and to actuate an alarm if the signal voltage is higher than the first reference voltage or lower than the second reference voltage.

10 Claims, 1 Drawing Figure

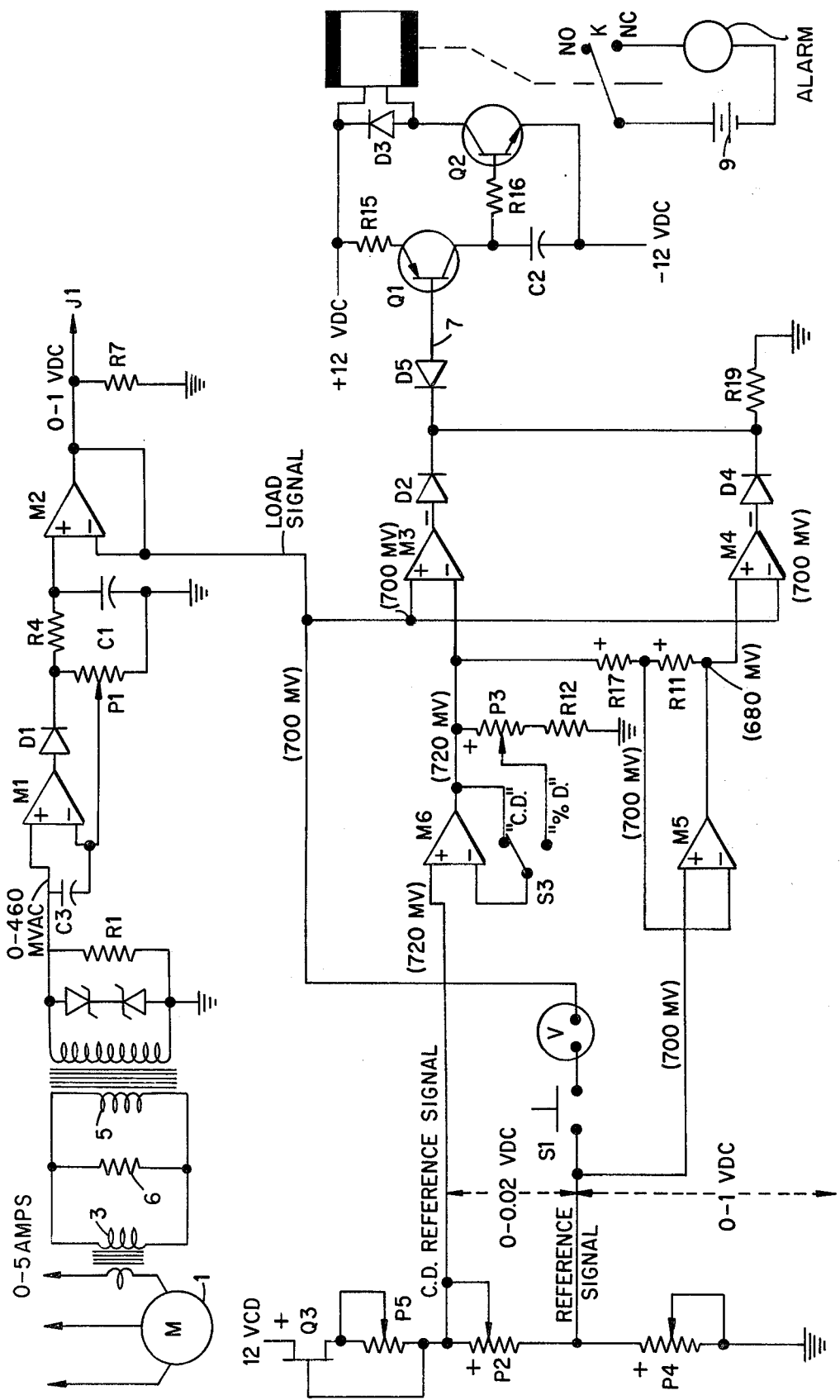

ADJUSTABLE ELECTRONIC LOAD-ALARM RELAY

This invention was made in the course of, or under, a contract with the U.S. Atomic Energy Commission.

BACKGROUND OF THE INVENTION

This invention relates broadly to electronic load-monitoring devices and more particularly to an improved adjustable-range electronic relay for giving warning when the current flow through a motor or other electrical load varies from a preselected operating range.

Mechanical alarm relays commonly are employed to monitor current flow through an electrical load and to energize alarm circuitry when the monitored current increases to a preselected high value or decreases to a preselected low value. The relay is provided with mechanical contacts for operating the alarm circuitry. It is typical for such relays to include a mechanical adjustment permitting re-setting of the high and low current values at which the relay alarms--that is, the relays are designed for mechanical adjustment of the alarm range.

Mechanical relays of the kind just described are characterized by various disadvantages. Being mechanical devices, the relays do not provide as high an alarm point accuracy and repeatability as would be desired. Also, such relays require various mechanical adjustments. Again, the relay contacts are often slow-acting and thus subject to arcing and chattering.

SUMMARY OF THE INVENTION

The present invention is designed to overcome various of the above-mentioned disadvantages. In addition, it is designed to permit setting of the alarm differential for three modes of operation. In a "constant differential" mode, the relay actuates an alarm if the current being monitored differs from the set point by a selected number of amperes. In a "percent differential" mode, the alarm is actuated if the current differs from the set point by a selected percentage of the set point. As will be described, the invention also permits operation in a combined constant- and percent-differential mode. While various electronic relays are in the art, none is known which provides the advantages of this invention.

The invention can be characterized broadly as follows: A circuit for monitoring an electrical current and energizing an alarm if the value of said current varies from a selected operating range comprising: means for generating a DC signal voltage continuously proportional to said current; means for generating a first DC reference voltage which exceeds a perselected value of said signal voltage by a selected first amount; means for generating a second DC reference voltage which is lower than said preselected value of said signal voltage by a selected second amount; first comparator means for comparing the first reference voltage with said load signal and generating an output voltage of selected polarity if said load signal exceeds the first reference voltage; second comparator means for comparing the second reference voltage with said load signal and generating an output voltage of said selected polarity if said load signal is less than the second reference voltage; and means connected to receive said output voltages for actuating an alarm if either of said output voltages is of said selected polarity.

Accordingly, it is an object of this invention to provide an electronic load alarm which, in terms of its alarm points, is characterized by high accuracy and high repeatability.

It is another object to provide an electric load alarm in which the high and the low alarm points can be set simultaneously by means of a single adjustment.

It is another object to provide an electronic load alarm which can be operated selectively in a constant-differential mode or a percentage-differential mode.

Other objects will be made evident hereinafter.

BRIEF DESCRIPTION OF THE DRAWING

The single FIGURE is a schematic diagram of an alarm circuit designed in accordance with this invention.

DESCRIPTION OF THE PREFERRED EMBODIMENT

Referring to the FIGURE, the preferred embodiment of the invention includes any suitable circuit for developing a low voltage DC output, or load signal, proportional to the current flow through an electric motor 1.

In the particular arrangement shown, the load signal is in the range of 0–1 V DC, each millivolt of the load signal corresponding to one amp of current through the motor. The circuit for developing this load signal includes a current transformer 3 (output, 0–5 amps) connected in circuit with the motor. A step-up transformer 5 (ratio, 1:4) is connected across a shunt 6 which bridges the current transformer secondary. The output of transformer 5 is 0–460 MV, which is impressed across a grounded resistor R1. The voltage across R1 is fed to a circuit where it is conditioned (rectified and filtered) to provide the desired load signal of 0–1 V DC. The conditioning circuit includes standard operational amplifiers M1 and M2, the output of M1 being impressed across an RC filter R4-C1 whose output is fed to M2. The resulting –1 V DC load signal from M2 is impressed across a grounded resistor R7 and, as will be described, is fed to a circuit for providing reference signals and to a signal comparator. A standard ±12 V DC supply (not shown) is provided for powering the amplifiers and the various circuits to be described.

Still referring to the FIGURE, a constant-current circuit is provided for developing both a "reference signal" and a "constant differential reference signal." This circuit includes a conventional constant-current regulator Q3-P5 for maintaining a flow of one milliamp through a series circuit consisting of potentiometers P2 (20 ohms) and P4 (1000 ohms) connected between the regulator and ground. Independent of the setting of P2, a voltage of 0–1 V DC is developed between the positive end of P4 and ground. The voltage drop across P2 can be varied from 0 to 0.02 V DC by movement of its slider. That is, depending on the setting of P2, the voltage from the positive end of P2 to ground is from 0 to 20 millivolts higher than the reference signal. The voltage from the positive end of P2 to ground, referred to as the "constant differential reference signal," is fed to a signal comparator.

Still referring to the constant-current circuit, an operator adjusts potentiometer P4 to set the voltage thereacross to a value matching the aforementioned load signal. That is, the operator closes a pushbutton S1 to momentarily connect the positive end of P4 to a voltmeter V whose other terminal is connected to receive the load signal. The operator adjusts P4 to null the meter. The voltage across P4, now matching the load signal, is referred to as the "reference signal," or set point. Each millivolt of the reference signal now corresponds to one amp through the motor being monitored. This signal is fed to the comparator circuit described below.

The signal comparator circuit includes a pair of operational amplifiers M5 and M6. The "constant-differential reference signal" is impressed on the non-inverting (+) pin of M6, whereas the "reference signal" is impressed on the non-inverting (+) pin of M5. With a switch S3 in the feedback lead of M6 in a "constant differential" position, M6 operates with a feedback ratio of 1:1. The output voltage of M6 is impressed across a series combination of a potentiometer P3 and resistor R12, the latter being connected to ground. As shown, the output lead of M6 also is connected to the minus pin of an operational amplifier M3.

As shown, the above-mentioned reference signal is impressed on the plus pin of amplifier M5. The output of M5 is impressed across a resistor R11, one end of which is connected to the positive pin of an operational amplifier. The other end of R11 is connected, through a resistor R17, to the output lead of M6. Resistors R11 and R17 are of equal resistance and function respectively as feedback and biasing resistors for amplifier M5. As shown, the aforementioned load signal is impressed on both the plus pin of M3 and the minus pin of M4.

The outputs of amplifiers M3 and M4 are fed in parallel to a common output lead 7. The voltage impressed on lead 7, referred to as the "load condition signal," is impressed on the base of a PNP transistor Q1. This transistor remains "On" so long as the outputs from both M3 and M4 are negative. As shown, a NPN transistor Q2 and a standard fast-acting relay are connected in series across Q1. When Q1 is conducting, Q2 is "On" and the relay is energized. In the energized state, RY1 holds open a contact K. Closing of this contact connects any suitable alarm A in circuit with a power supply 9 therefor. As shown, the base of Q2 is connected to the collector of Q1 through a resistor R16, and a capacitor C2 is connected in the collector lead of Q1 to bridge R16 and the base-and-emitter portion of Q2. When Q1 is "On," C2 is charged. The occurrence of an alarm condition turns off Q1, but the resulting discharge of C2 through R16 holds Q2 "On" for a selected period. Thus, an alarm condition must exist for a selected time (e.g., 2 seconds) prior to alarm actuation. Conversely, after the alarm has been actuated it must remain "On" for the same period after the alarm condition disappears. This provision eliminates relay chattering.

To illustrate a typical operation of the invention, it will be assumed that the motor being monitored is drawing 700 amps and that an alarm is desired in the event the current varies from that value by more than ±20 amps. To meet this requirement, the operator closes pushbutton S1 momentarily and adjusts P4 to null the meter V, thus balancing out the load signal. This sets the reference signal at 700 MV, corresponding to the load of 700 amps. The operator then adjusts the slider of P2 to its upper limit, where the constant differential signal exceeds the reference signal by 20 MV. (Preferably, P2 is calibrated linearly in amps, with the positive end corresponding to 20 amps). With P2 now set at 20 amps, a "constant-differential reference signal" of 720 MV is impressed on the plus pin of amplifier M6. This amplifier, which operates with 100 percent feedback with S3 set as shown, develops an output voltage of 720 MV.

Referring to amplifier M5, a reference voltage of 700 MV is impressed on its plus pin. M5 forces the junction of resistors R11 and R17 to 700 MV. No current flows in the feedback lead connected to the minus pin of amplifier M5, and consequently sufficient current must flow from the 720-MV line through R17 to develop a 20-MV drop across that resistor. This current also flows through R11, developing a 20-MV drop thereacross. As a result, a voltage of 680 MV is established at the negative end of R11 and at the plus pin of M4. Thus, as indicated in FIG. 1, the outputs of amplifiers M3 and M4 are both negative, with the result that Q1 and Q2 are "On" and contact K is held open.

If the motor load now changes from the set point (700 amps) by less than the constant-diferential setting (20 amps), the outputs of M3 and M4 remain negative, and contact K remains open. If, however, the load changes by slightly more than 20 amps, the output of one of the amplifiers is driven positive. For example, if the motor load increases to 723 amps, the load signal applied to the amplifiers M3 and M4 increases to 723 MV. This change drives the M3 output to positive. This turns "Off" Q1 and then (after the above-mentioned time delay) turns "Off" Q2, de-energizing RY1 and closing contact K to activate the alarm. Similarly, a decrease of more than 20 amps in the 700-amp motor load reverses the polarity of the M4 output, actuating the alarm. If the operator should find it necessary to readjust the reference signal (set point) to a new value of, say, 500 amps, the circuit then will continue to operate with the same alarm differential (20 amps) unless the operator chooses to change the differential by re-setting P2. It will be noted that this circuitry permits the operator to set both the high and low alarm points by means of only one adjustment.

With the switch S3 set in its "percent differential" position, potentiometer P3 is incorporated in the feedback circuit for amplifier M6. In the particular embodiment shown, P3 can vary the feedback to M6 over a range of from 90 to 100 percent. That is, with the slider positioned at the negative end of P3, the feedback to M6 is reduced by 10 percent, increasing the M6 output to 110 percent. The effect of P3 will be illustrated first for the condition where (a) P4 has been adjusted for a set point of 700 amps, (b) P2 has been set for zero amps constant differential, and (c) P3 is set at 10 percent. With these settings, the input to the positive pins of M5 and M6 is 700 MV. The output from M6 is 770 MV (110 percent of its input). Thus, the plus pin of M3 is at 700 MV and its minus pin is at 770, and the output of M3 is negative. Amplifier M5 has an input of 700 MV and operates as previously described to establish that voltage at the junction of R11 and R17. The resulting current flow through R11 and R17 establishes a voltage drop of 70MV across each. Thus, with its plus pin at 630 MV and its minus pin at 700 MV, the output of M4 is negative. The alarm A is not activated unless the motor current changes by slightly more than 10 percent of the value of the set point, thus swinging the output of either M3 or M4 to positive.

A different alarm differential is obtained if P4 is set for 700 amps and P3 is set to reduce the feedback to M6 by 10 percent, but P2 is set for 20 amps constant differential. In this case the M6 output is 792 MV (110 percent of the 720-MV input). The plus pin of M3 is at 700 MV and its minus pin is at 792. The input to M5 is 700 MV, and thus the junction of R11 and R17 is at that voltage. Voltage drops of 92 MV each are established across R11 and R17. The plus pin of M4 is at 608 MV and its negative pin is at 700. The alarm is actuated only if the present alarm differential—92 MV—is exceeded. That is, when P2 and P3 are both in the circuit in the alarm limits (e.g., 792 MV and 608 MV) correspond to the set pont ± the constant differential ± the selected percentage. At a set point of 500 amps, a constant-differential setting of 10 amps and a percent-differential setting of 5 percent, the alarm limits are 535.5 and 464.5 amps.

Operation in only the above described constant-differential mode is suitable for many process applications. In some applications, it is desirable to provide essentially the same proportion of process control whether the process motor is lightly loaded or heavily loaded. This need is not met by constant-differential operation but is met by percent differential operation. Assume, for example, that a process motor is running with a light load (e.g., set point at 400 and P3 at 3 percent). If the motor then is heavily loaded (e.g., the operator readjusts the set point to 800 amps), the same 3 percent setting of P3 permits a wider absolute variation in motor current without actuating the alarm. Thus, a 3 percent load change is allowed at any level of process operation.

The circuit shown in the FIGURE is designed to be fail-safe. Loss of the ±12-volt power source will actuate the alarm. The AC portion of the circuit is essentially insensitive to external radio-frequency signals (e.g. walkie-talkies), owing to the provision of a capacitor C3 across the input of amplifier M1.

A circuit similar to that shown in the FIGURE was designed to monitor the load drawn by compressor-drive motors installed in a gaseous-diffusion plant for the separation of uranium isotopes. The circuit was composed throughout of standard components. For example, the operational amplifiers M1-M6 were Model 3741, manufactured by Radio Corporation of America; essentially equivalent results can be obtained with Model 72741, produced by Texas Instruments Company. The transistors Q1 and Q2 were types GE-21 and GE-17, manufactured by General Electric Company. The relay RY1 was Model HP-11D, produced by Potter-Brumfield Company. The voltage limiters across the output of transformer 5 were conventional zener diodes. The blocking diodes D1-D5 were of the IN-4531 type. The values of some of the other components of the circuit are given below.

C1, 47 uf; C2, 22uf; C3, 1000 pf; Q3, 2N-3436 P1, 100K; P2, 20 ohms; P3, 1K; P4, 1K R1, 270K; R7, 10K; R11, 10K, R12, 9.1K; R17, 10K; R19, 2 megohms The circuit performed very satisfactorily. For example, with a set point of 600 amps the alarm repeatability was found to be ±1 amp. The load signal (output from M2) was highly linear with respect to the motor current being monitored, the linearity being ½ percent or better. Thus, if desired, the electronic relay circuit also can be utilized as a motor load current transducer. In that case, a jack J1 (see FIGURE) can be provided for connection to data monitoring equipment or the like. No chattering of the relay contact was experienced. Arcing at the contact was minimal.

It will be apparent to those versed in the art that various alterations or modifications can be made in the embodiment described above without departing from the principle of the invention. For example, the resistors R11 and R17 can be proportioned so that the high and low alarm points are not equally displaced from the set point. That is, if R11 is twice as large as R17, the difference between the lower alarm point and the set point will be twice that between the upper alarm point and the set point. Again, if desired, the circuit can be modified so that the alarm action of RY1 is reversed and no alarm is generated in the event of an electronic power supply failure. This may be accomplished by replacing Q1 with a Q2-type transistor, omitting R19 and shorting R15 and D5. With this variation C2 also will provide a minimum alarm duration of 2 seconds, eliminating relay chatter.

What is claimed is:

1. An alarm circuit for monitoring an electrical current and actuating an alarm if the value of said current varies from a selected operating range comprising
   a. means for generating a DC signal voltage continuously proportional to said current;
   b. means for generating at an output a first constant DC reference voltage which exceeds a preselected value of said signal voltage by a selected amount;
   c. a series circuit comprising a first resistor connected to a second resistor, one end of said series circuit being connected to the output of said means for generating the first reference voltage;
   d. means for generating at an output a second constant DC reference voltage which is lower than said preselected value by a selected amount and for impressing the second reference voltage on the other end of said series circuit while maintaining the junction of the first and second resistors of said series circuit at a DC voltage equal to said signal voltage;
   e. first comparator means for comparing the voltage at said one end of said series circuit with said signal voltage and generating a first output signal indicative of said load signal being higher than the first reference voltage;
   f. second comparator means for comparing the voltage at said other end of said series circuit with said signal voltage and generating a second output signal indicative of said load signal being lower than the second reference voltage; and
   g. means connected to the outputs of the first and second comparator means for rseponding to either of the first and second output signals by actuating an alarm.

2. The combination of claim 1 wherein said means for generating the second reference voltage includes an operational amplifier having a non-inverting input terminal connected to a source of DC voltage equal to said signal voltage, an inverting terminal connected to said junction, and an output terminal connected to said other end of said series circuit.

3. The combination of claim 2 wherein the first and second resistors of said series circuit are of equal value.

4. The combination of claim 1 wherein said means for generating the first reference voltage includes an operational amplifier having an output terminal connected to said one end of said series circuit, a non-inverting input terminal connected to a source of DC voltage exceeding said signal voltage by said selected amount, and an inverting input terminal coupled to its output terminal.

5. The combination of claim 4 wherein the inverting input terminal of said operational amplifier is coupled to its output terminal through switching means for selectively inserting a relatively low resistance and a relatively high resistance therebetween.

6. An alarm circuit for monitoring an electrical current and generating an alarm signal if the value of said current varies from a selected operating range comprising
   a. means for generating a DC signal voltage proportional to said current;
   b. a first operational amplifier having an output terminal, a non-inverting input terminal connected to a source of a first constant DC reference voltage exceeding a preselected value of said signal voltage by a selected amount, and an inverting input terminal coupled to its output terminal;
   c. a second operational amplifier having an output terminal, a non-inverting input terminal connected to a source of a second constant DC reference voltage equal to said signal voltage, and an inverting input terminal connected to its output terminal through a feedback resistor;
   d. a biasing resistor for the second operational amplifier, said biasing resistor being connected between the inverting input terminal thereof and the output terminal of the first operational amplifier;
   e. means for comparing both the voltage output of the first operational amplifier and the voltage output of the second operational amplifier with said signal voltage and generating a signal indicative of either of the voltage output of the first operational amplifier being higher than said load signal and the voltage output of the second operational amplifier being lower than said load signal.

7. The combination of claim 6 wherein said feedback resistor and said biasing resistor are of equal value.

8. The combination of claim 6 wherein the inverting terminal of the first operational amplifier is coupled to the output terminal thereof through means for altering the resistance therebetween.

9. The combination of claim 6 wheerein said means for comparing includes an operational amplifier having an input terminal connected to the output of said means for generating a DC signal voltage and having an input terminal connected to the output of the first operational amplifier.

10. The combination of claim 9 wherein said means for comparing also includes an operational amplifier having an input terminal connected to the output of said means for generating a DC signal voltage and having an input terminal connected to the output of the second operational amplifier.

* * * * *